(12) United States Patent
Gubser et al.

(10) Patent No.: US 10,126,530 B2
(45) Date of Patent: Nov. 13, 2018

(54) FABRICATION OF OPTICAL ELEMENTS AND MODULES INCORPORATING THE SAME

(71) Applicant: Heptagon Micro Optics Pte. Ltd., Singapore (SG)

(72) Inventors: Simon Gubser, Weesen (CH); Hakan Karpuz, Au (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/271,288

(22) Filed: Sep. 21, 2016

(65) Prior Publication Data

US 2017/0010450 A1  Jan. 12, 2017

Related U.S. Application Data

(62) Division of application No. 14/140,712, filed on Dec. 26, 2013, now Pat. No. 9,478,681.

(Continued)

(51) Int. Cl.
| | |
|---|---|
| *H01L 33/60* | (2010.01) |
| *G02B 13/00* | (2006.01) |
| *H01L 31/0232* | (2014.01) |
| *H01L 27/146* | (2006.01) |
| *G02B 3/00* | (2006.01) |
| *G02B 5/00* | (2006.01) |

(Continued)

(52) U.S. Cl.
CPC ....... *G02B 13/0085* (2013.01); *G02B 3/0031* (2013.01); *G02B 5/005* (2013.01); *H01L 27/14625* (2013.01); *H01L 27/14627* (2013.01); *H01L 27/14685* (2013.01); *H01L 31/02325* (2013.01); *H01L 31/02327* (2013.01); *H01L 33/58* (2013.01); *H01L 51/5275* (2013.01); *H01S 5/005* (2013.01); *G02B 5/1852* (2013.01)

(58) Field of Classification Search
CPC .......... G02B 13/0085; H01L 27/14625; H01L 27/14685; H01L 31/02325; H01L 51/5275
See application file for complete search history.

(56) References Cited

U.S. PATENT DOCUMENTS 5,655,189 A * 8/1997 Murano .................... B41J 2/451
  359/820
2006/0113701 A1   6/2006 Rudmann
(Continued)

FOREIGN PATENT DOCUMENTS

| CN | 1752775 | 3/2006 |
|---|---|---|
| CN | 1950724 | 4/2007 |

(Continued)

OTHER PUBLICATIONS

European Search Report issued in European Application No. 13868663.9, dated Jul. 29, 2016, 4 pages.

(Continued)

*Primary Examiner* — Frederick B Hargrove
(74) *Attorney, Agent, or Firm* — Fish & Richardson P.C.

(57) ABSTRACT

Fabricating a wafer-scale spacer/optics structure includes replicating optical replication elements and spacer replication sections directly onto an optics wafer (or other wafer) using a single replication tool. The replicated optical elements and spacer elements can be composed of the same or different materials.

5 Claims, 7 Drawing Sheets

Related U.S. Application Data (60) Provisional application No. 61/746,347, filed on Dec. 27, 2012.

(51) Int. Cl.
*H01L 33/58* (2010.01)
*H01L 51/52* (2006.01)
*H01S 5/00* (2006.01)
*G02B 5/18* (2006.01)

(56) References Cited

U.S. PATENT DOCUMENTS

| | | | | |
|---|---|---|---|---|
| 2009/0213469 A1* | 8/2009 | Braune | ............... | B29C 45/1615 |
| | | | | 359/642 |
| 2011/0013292 A1* | 1/2011 | Rossi | ................ | H01L 27/14621 |
| | | | | 359/738 |
| 2011/0032409 A1* | 2/2011 | Rossi | ..................... | G02B 5/005 |
| | | | | 348/340 |
| 2011/0050979 A1* | 3/2011 | Rudmann | ......... | H01L 27/14623 |
| | | | | 348/335 |
| 2011/0063487 A1 | 3/2011 | Yamada et al. | | |
| 2011/0063731 A1 | 3/2011 | Yamada et al. | | |
| 2011/0149143 A1 | 6/2011 | Tsujino | | |
| 2013/0003199 A1* | 1/2013 | Jeong | ............... | B29D 11/00375 |
| | | | | 359/819 |
| 2013/0271826 A1 | 10/2013 | Widmer | | |

FOREIGN PATENT DOCUMENTS

| | | |
|---|---|---|
| CN | 101366127 A | 2/2009 |
| CN | 102023324 A | 4/2011 |
| CN | 102668082 | 9/2012 |
| JP | 2011-64873 A | 3/2011 |
| TW | 201249636 A | 12/2012 |
| WO | 2004/068198 | 8/2004 |
| WO | 2009/133756 | 11/2009 |
| WO | 2010/050290 | 5/2010 |
| WO | 2012/100356 | 8/2012 |
| WO | 2014/012603 | 1/2014 |

OTHER PUBLICATIONS

The State Intellectual Property Office of the People's Republic of China, Search Report in Chinese Patent Application No. 2013800674703, 2 pages (dated Mar. 2, 2016) (with translation).
Office Action issued in Chinese Application No. 201380067470.3, dated Jan. 4, 2017, 9 pages (with English translation of Search Report).

* cited by examiner

FABRICATION OF OPTICAL ELEMENTS AND MODULES INCORPORATING THE SAME

CROSS-REFERENCE TO RELATED APPLICATION(S)

This application is a divisional of U.S. application Ser. No. 14/140,712, filed on Dec. 26, 2013, which claims the benefit of priority U.S. Application No. 61/746,347, filed on Dec. 27, 2012. The disclosure of the prior applications are incorporated herein by reference.

TECHNICAL FIELD

This disclosure relates to the fabrication of optical elements, and to devices incorporating such optical elements.

BACKGROUND

Integrated optical devices are used in a wide range of applications, including, for example, camera devices, optics for camera devices and collimating optics for flash lights, such as those used in cameras for mobile phones. The integrated optical devices can include functional elements (e.g., one or more optical elements) that are stacked together along the general direction of light propagation. The functional elements can be arranged in a predetermined spatial relationship with respect to one another so that light traveling through the device passes through the various elements sequentially. The integrated optical device then may be incorporated into another system.

Integrated optical devices as described above can be manufactured by stacking wafers one atop the other in a well-defined spatial relationship. Although such wafer-scale manufacturing processes have proven effective, further efficiency is desirable while still allowing some flexibility in the process.

SUMMARY

The disclosure describes a method of fabricating a wafer-scale spacer/optics structure. Optical replication elements and spacer replication sections can be replicated directly onto an optics wafer (or other wafer) using a single replication tool. Depending on the implementation, replicated optical elements and spacer elements can be composed of the same or different materials.

For example, according to one aspect, a method of fabricating a wafer-scale spacer/optics structure includes providing a replication tool having optical element replication sections and spacer replication sections, using the replication tool to form negatives of the optical element replication sections on a wafer so as to provide replicated optical elements of a first material, and using the replication tool to form negatives of the spacer replication sections on the wafer so as to provide replicated spacer elements of a second material different from the first material.

According to another aspect, a method of fabricating a wafer-scale spacer/optics structure includes providing a replication tool having optical element replication sections and spacer replication sections, providing a first liquid, viscous or plastically deformable material onto the optical replication sections of the replication tool, bringing a wafer into contact with the replication tool so that the first liquid, viscous or plastically deformable material is pressed between a surface of the wafer and the optical replication sections, and hardening the first liquid, viscous or plastically deformable material to form replicated optical elements on a surface of the wafer. The method further includes bringing a vacuum sealing chuck into contact with a backside of the wafer while the wafer remains in contact with the replication tool, injecting a second liquid, viscous or plastically deformable material through an inlet of the vacuum sealing chuck so as to substantially fill locations for the replicated spacer elements, and hardening the second liquid, viscous or plastically deformable material to form replicated spacer elements on the surface of the wafer.

Modules can be fabricated, for example in wafer-scale processes such that the resulting modules include replicated structures such as a spacer element and an optical element. The optical element can be aligned, for example, with an opto-electronic component (e.g., a light emitting or light sensing element).

The details of one or more implementations are set forth in the accompanying drawings and the description below. Other aspects, features, and advantages will be apparent from the detailed description and drawings, and from the claims.

DETAILED DESCRIPTION

Figure 1:
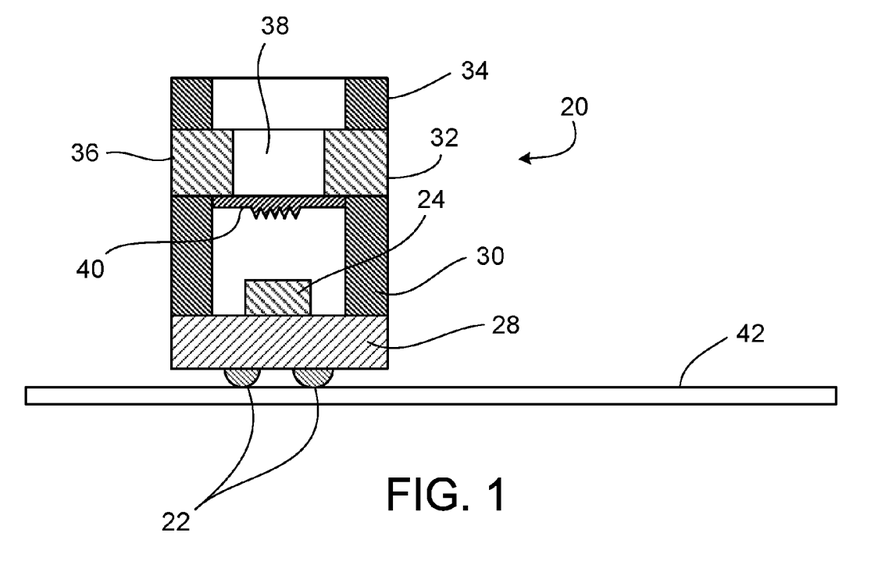
FIG. 1 is a cross-sectional view of an example of an opto-electronic module.

FIG. 1 illustrates an example of an opto-electronic module 20 that houses an active optical component 24 such as a light emitting element or a light sensing element. Examples of light emitting elements include LEDs, OLEDs and laser chips; examples of light sensing elements include photodiodes and image sensors. Module 20 also includes at least one passive optical element 40. Passive optical element 40 can redirect light, for example, by refraction and/or diffraction and/or reflection and can include, e.g., one or more lenses or prisms.

Module 20 includes several constituents stacked upon each other in the vertical direction. In the example of FIG. 1, module 20 includes a substrate 28, a spacer member 30, an optics member 32 and a baffle 34. Optical component 24 is mounted on substrate 28 and is encircled by walls of spacer member 30. Electrical contacts for optical component 24 are connected electrically to outside module 20, where solder balls 22 are attached. Instead of solder balls 22, some implementations include contact pads on substrate 28, which may be provided with solder balls at a later time. Module 20 can be mounted on a printed circuit board 42, e.g., using surface mount technology (SMT), next to other electronic components. Printed circuit board 42 may be a component of an electronic device such as a mobile phone or other appliance. Module 20 is particularly suitable for such applications because it can be manufactured to have a particularly small size and is mass-producible using wafer-level manufacturing techniques.

In the example of FIG. 1, optics member 32 has light blocking portions 36, and a transparent portion 38 through which light can leave module 20 and/or through which light can enter from outside module 20. Passive optical element 40, which is attached to optics member 32, can help guide light to or from optical component 24.

In the illustrated example of FIG. 1, spacer member 30 and optical element 40 are replicated structures that can be composed of the same or different materials and that can be formed using a single replication tool. This and the following paragraphs describe a replication technique for fabricating spacer member 30 and passive optical element 40. In general, replication refers to a technique by means of which a given structure or a negative thereof is reproduced, e.g., etching, embossing or molding. In a particular example of a replication process, a structured surface is embossed into a liquid, viscous or plastically deformable material, then the material is hardened, e.g., by curing using ultraviolet radiation or heating, and then the structured surface is removed. Thus, a replica (which in this case is a negative replica) of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state.

Figure 2A:
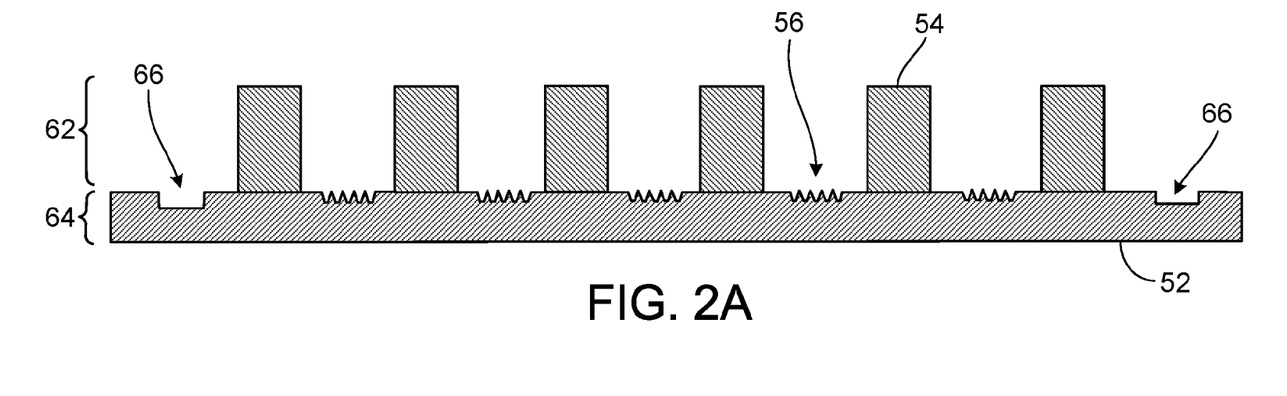
FIG. 2A is a cross-sectional view of a master wafer-scale spacer/optics structure.
Figure 2B:
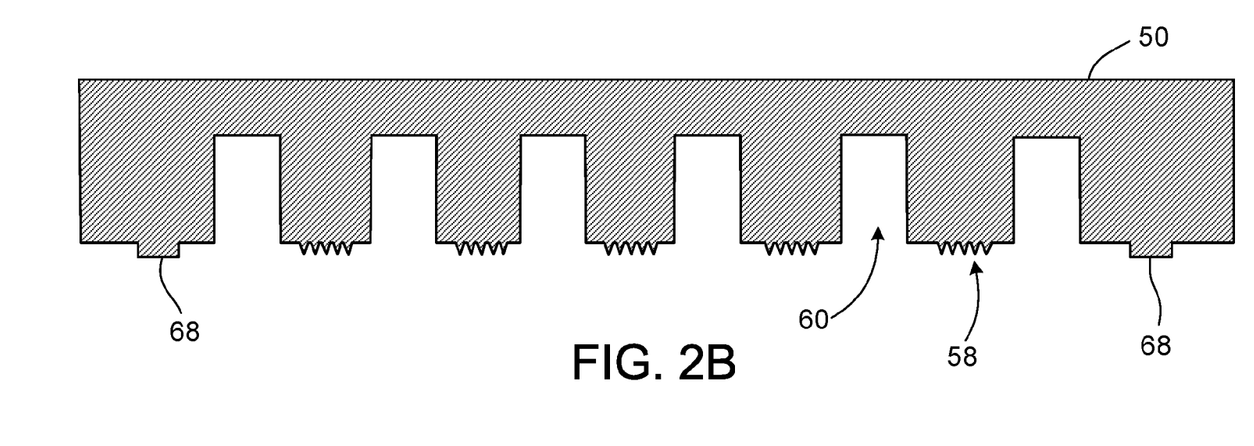
FIG. 2B is a cross-sectional view of a replication tool for making wafer-scale spacer/optics structures.

The replication process involves providing a replication tool that has structures to replicate optical elements (such as optical element 40) and spacer members (such as spacer member 30). The replication tool 50 itself can be fabricated, for example, by replication from a master (or submaster) wafer-scale spacer/optics structure 52 as illustrated in FIGS. 2A and 2B. Master 52 includes features 54 that correspond to the size and shape of spacer replication sections 60 on the front side of replication tool 50, and also includes features 56 that correspond to the size and shape of optical element replication sections 58 on the front side of replication tool 50. In the illustrated example, spacer replication sections 60 on replication tool 50 are indented areas on the front side of replication tool 50. Each of optical element replication sections 58 has features that correspond to the negative of optical element 40 in FIG. 1. Master 52 also has depressions 66 near its outer periphery. Depressions 66 correspond to local spacer replication sections 68 on the front side of replication tool 50. Master 52 can be composed, for example, of glass, metal or epoxy materials and includes a master (or submaster) spacer wafer 62 bonded to a master (or submaster) optics wafer 64 that includes features 56.

To make replication tool 50 from master 52, a silicone material such as polydimethylsiloxane (PDMS) is poured over replication tool 50. A glass plate with a sacrificial mold release support (e.g., a foil of a suitable plastic such as ployethylenterephthalat) can be placed on top of master 52 to press the silicone material into the areas of features 54, 56. After the silicone material is hardened, the glass plate and release support are moved away from the hardened silicone, which is removed from master 52, resulting in replication tool 50, as shown in FIGS. 2B and 2C.

Figure 2C:
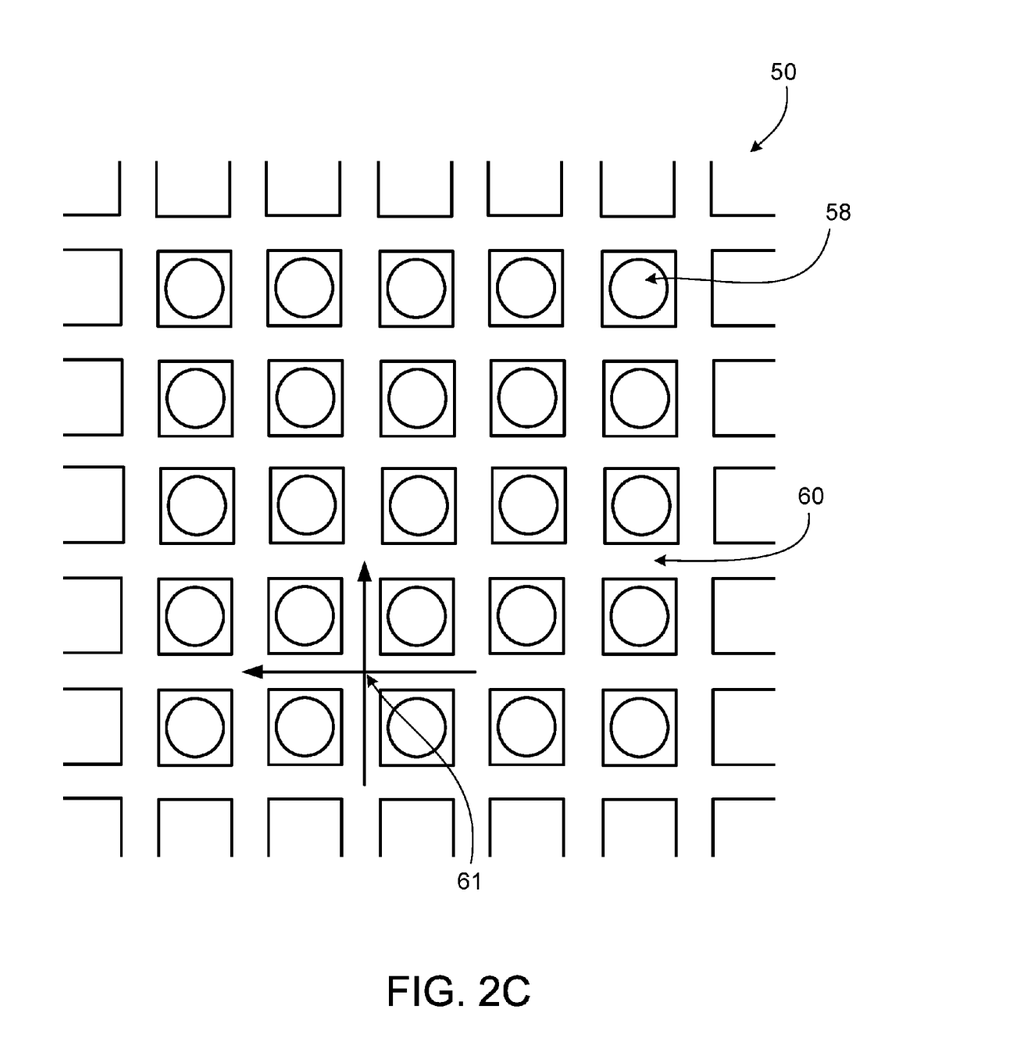
FIG. 2C is a top view of part of the replication tool.

As illustrated in FIG. 2C, optical element replication sections 58 of replication tool 50 can be formed atop pillars, and spacer replication sections 60 can be formed as an interconnected grid. Local spacer replication section 68 also can be formed atop a pillar. This arrangement allows replication material to flow into spacer replication sections 60, as described below in connection with FIG. 3D.

Figures 3A, 3B:
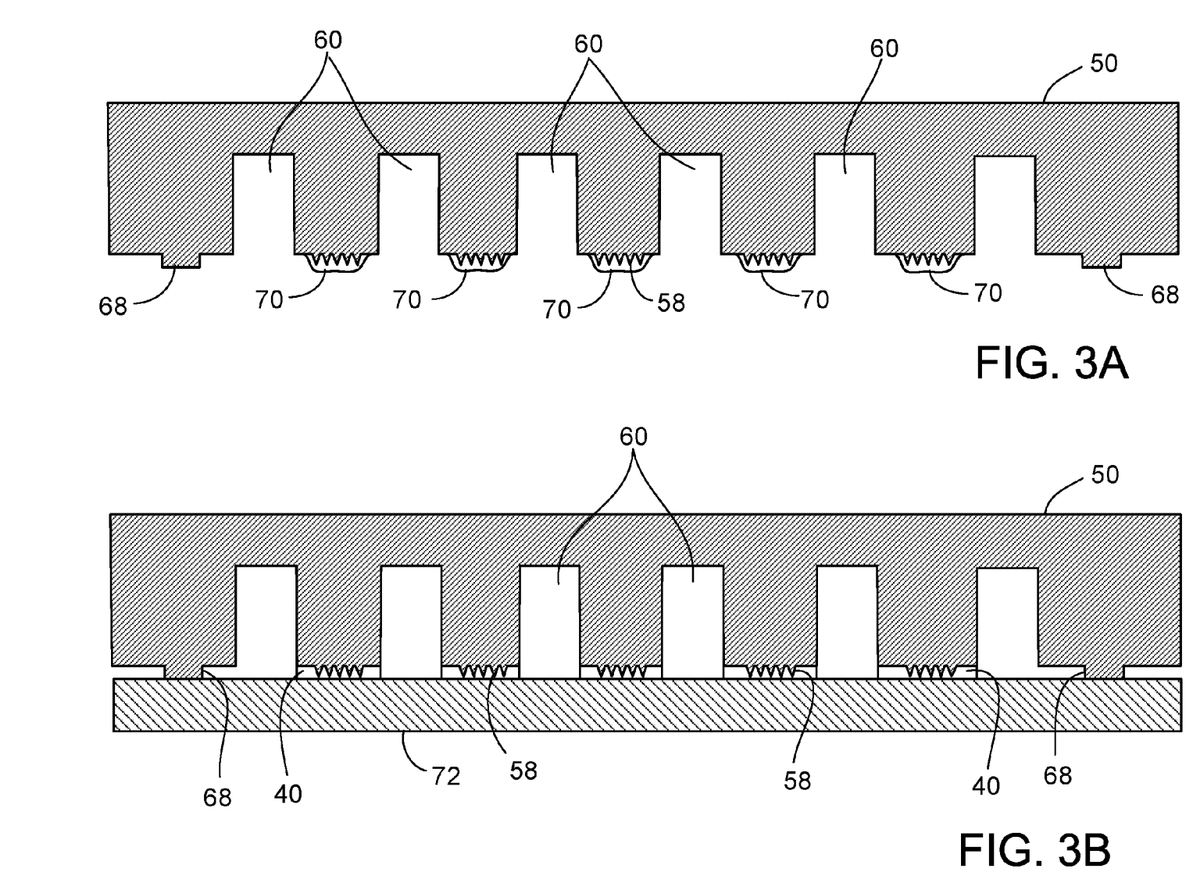
FIGS. 3A through 3D illustrate a technique of making a replicated wafer-scale spacer/optics structure.

Replication tool 50 then can be used to form a wafer-scale structure that includes both replicated spacers and optical elements, for example, in an array (e.g., a grid formation). As explained below, negatives of optical replication elements 58 and spacer replication sections 60 can be replicated directly onto an optics wafer (or other wafer) using the same replication tool 50. As illustrated in FIG. 3A, the optical element structures (e.g., lenses) are replicated by providing a first replication material 70 on optical element replication sections 58 of replication tool 50. Replication material 70 is a material that is capable of being brought from a liquid or plastically deformable state into a solid state. An example of replication material 70 is a UV or thermal-curable transparent epoxy. Replication material 70 can be poured or dispensed onto optical element replication sections 58 of replication tool 50.

Next, as shown in FIG. 3B, an optics wafer (or other wafer) 72 is brought into contact with local spacer replication sections 68 of replication tool 50 as part of a first replication step. This causes replication material 70 to be pressed between the areas defining optical element replication sections 58 and the surface of optics wafer 72. Optical element replication sections 58 are thereby embossed on replication material 70.

Local spacer replication sections 68 on replication tool 50 serve to define a relative vertical position of replication tool 50 and optics wafer 72 and, in some implementations, to keep optics wafer 72 at a slight, predefined distance from optical element replication sections 58.

Optics wafer 72 can be composed entirely of a transparent material such as glass or a transparent plastic material. In some implementations, optics wafer 72 is composed of a non-transparent material (e.g., a glass-reinforced epoxy laminate sheets ("FR4") or black epoxy) that has openings filled with a transparent material. In such implementations, the areas of non-transparent material can be provided to correspond to light blocking portions 36 of optics member 32, and areas of transparent material can be provided to correspond to transparent portion 38 of optics member 32 (see FIG. 1). In that case, transparent regions of optics wafer 72 should be aligned with optical element replication section 68 of replication tool 50 so that the replicated optical elements will be formed on the transparent regions of the optics wafer.

As part of the first replication step, UV radiation is directed at replication material 70 to cure (i.e., harden) the replication material. The UV radiation can be incident from the tool side (in which case, replication tool 50 needs to be transparent to the UV radiation) or from the optics wafer side. In some implementations, instead of UV (i.e., optical) curing, replication material 70 is hardened by thermal curing. In any event, replicated optical elements 40 are thereby formed on the surface of optics wafer 72.

Figure 3C:
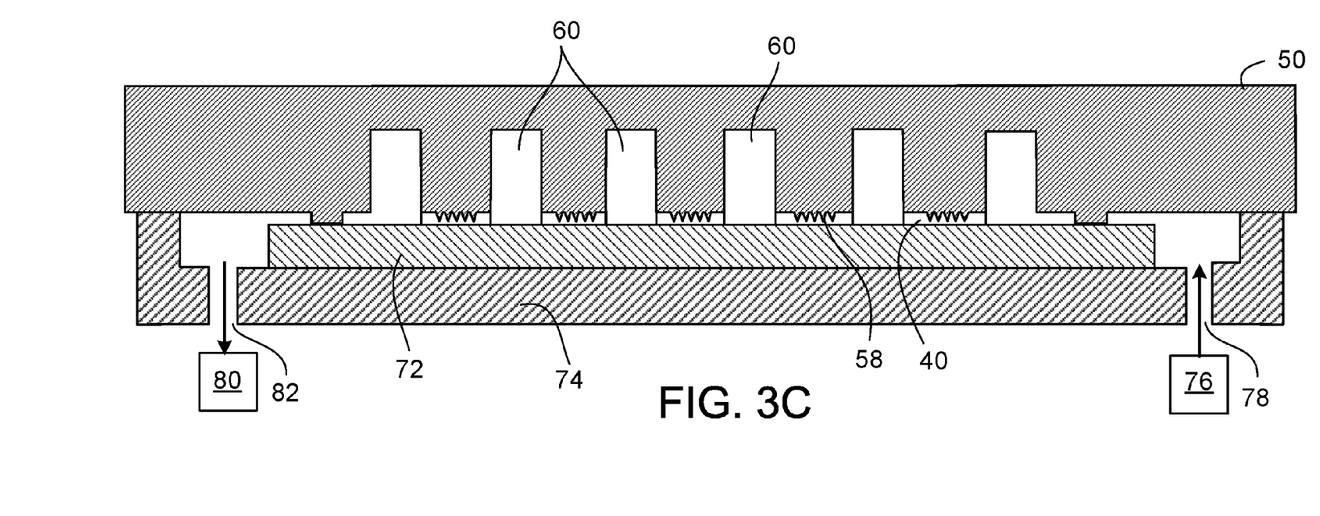

In a second replication step, as shown in FIG. 3C, a PDMS vacuum sealing chuck 74 is brought into contact with the backside of optics wafer 72 (i.e., the surface of optics wafer 72 opposite the surface on which replicated optics elements 58 were formed). This step is performed before releasing replication tool 50 from optics wafer 72. A second replication material 76 then is injected into an inlet 78 in vacuum sealing chuck 74. Second replication material 76 also is a material that is capable of being brought from a liquid or plastically deformable state into a solid state. An example of replication material 76 is a UV or thermal-curable epoxy, which may be either transparent or non-transparent (i.e., black). Second replication material 76 can be the same as, of different from, first replication material 70. In some implementations, for example, first replication material 70 is substantially transparent to a particular wavelength (or range of wavelengths such as visible light), whereas second replication material 76 is substantially non-transparent to the same wavelength or range of wavelengths.

A vacuum pump 80 provided near an outlet 82 of vacuum sealing chuck 74 facilitates replication material 76 flowing around the optical element replication sections 58 of replication tool 50 and filling spacer replication sections 60. See FIG. 2C, in which arrows 61 indicate the flow of replication material 76. Replication material 76 also fills the area adjacent the previously hardened replication material 70 just above optics wafer 72. Thus, replication material 76 can be is in contact with, and abut, replication material 70.

As part of the second replication step, UV radiation is directed at replication material 76 to cure (i.e., harden) the replication material. The UV radiation can be incident from the tool side (in which case, replication tool 50 needs to be transparent to the UV radiation) or from the optics wafer side. In some implementations, instead of UV (i.e., optical) curing, replication material 76 is hardened by thermal curing. The injected replication material 76 forms a continuous grid of spacer structure such that replicated spacer elements 30 are formed on the surface of optics wafer 72 (see FIG. 3D).

Figure 3D:
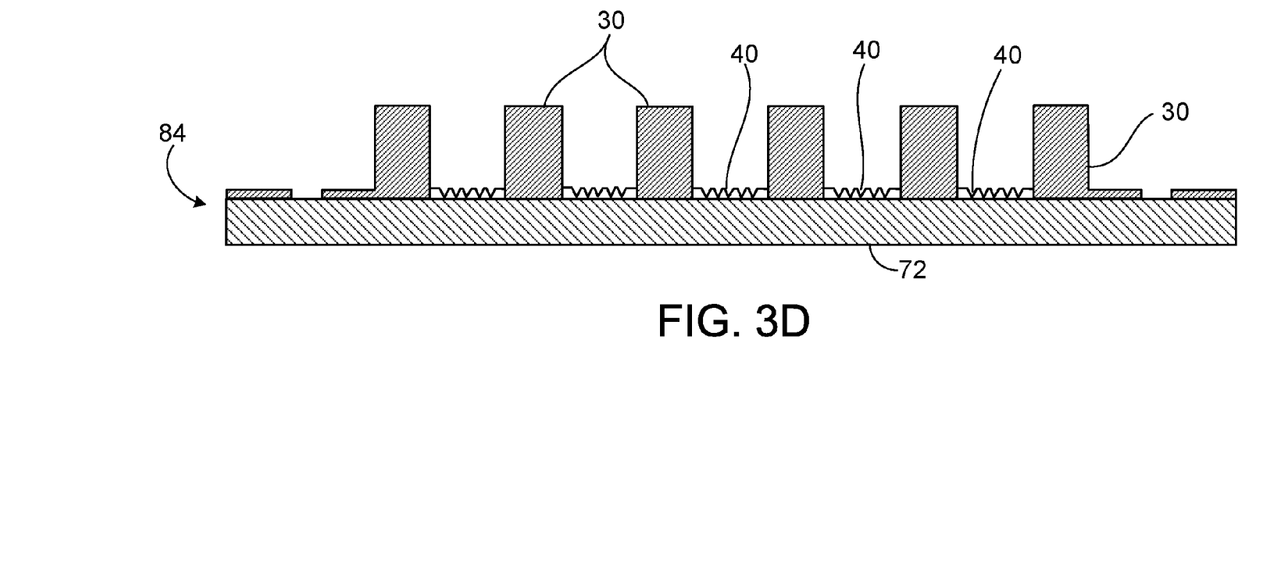

After curing replication material 76, the wafer-scale spacer/optics structure 84 is released from replication tool 50 and from vacuum sealing chuck 74. The resulting wafer-scale structure 84 includes a grid of replicated optical elements 40 and spacer elements 30 on optics wafer 72 (FIG. 3D). In the illustrated example, replicated optics elements 40 are separated from adjacent optical elements 40 by replicated spacer elements 40. Optical elements 40 are in contact with, or abut, the sides of spacer elements 30, although this need not be the case in all implementations. The structure 84 is a replica of the replication side of replication tool 50 (FIG. 3A) and is similar to master wafer-scale spacer/optics structure 52 (FIG. 2A).

In some implementations, spacer elements 30 extend (in the vertical z-direction) beyond optical elements 40 by about 100-1500 μm, where the thickness of the optical elements 40 is about 50-600 μm. The features form an array (e.g., a grid) that repeats (in the lateral x-y directions), for example, every 1-10 mm, or in some cases, every 2-5 mm. Different dimensions may be applicable to other implementations.

Figure 4:
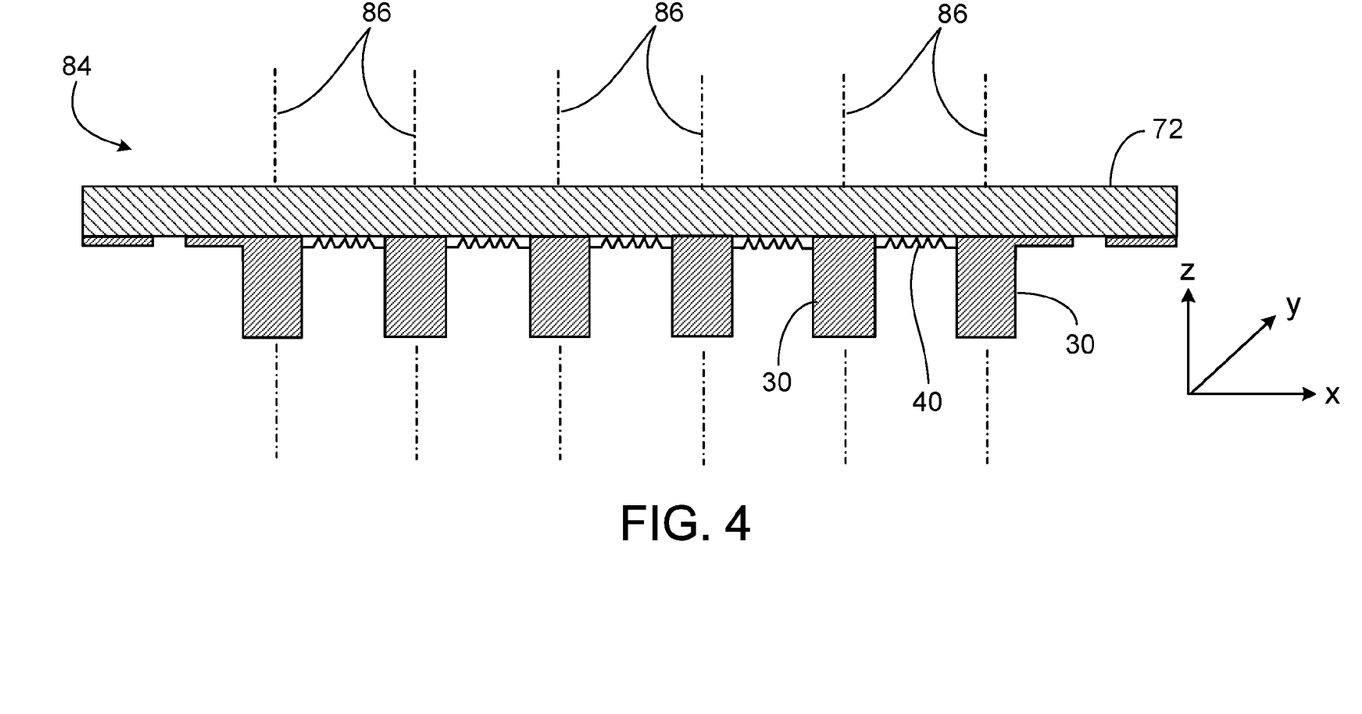
FIG. 4 illustrates dicing of the wafer-scale spacer/optics structure into individual spacer/optics structures.

In some implementations, as indicated in FIG. 4, wafer-scale spacer/optics structure 84 is separated along separation lines 86 into multiple individual optical structures, each of which includes an optical element 40 (e.g., a lens) disposed on a section of optics wafer 72 and encircled by walls of spacer elements 30. Wafer-scale spacer/optics structure 84 can be separated, for example, by dicing, laser cutting, punching, water jet cutting or other separation techniques. The individual optical structures can be incorporated to optical, opto-mechanical, opto-electronic, or other devices.

Figure 5:
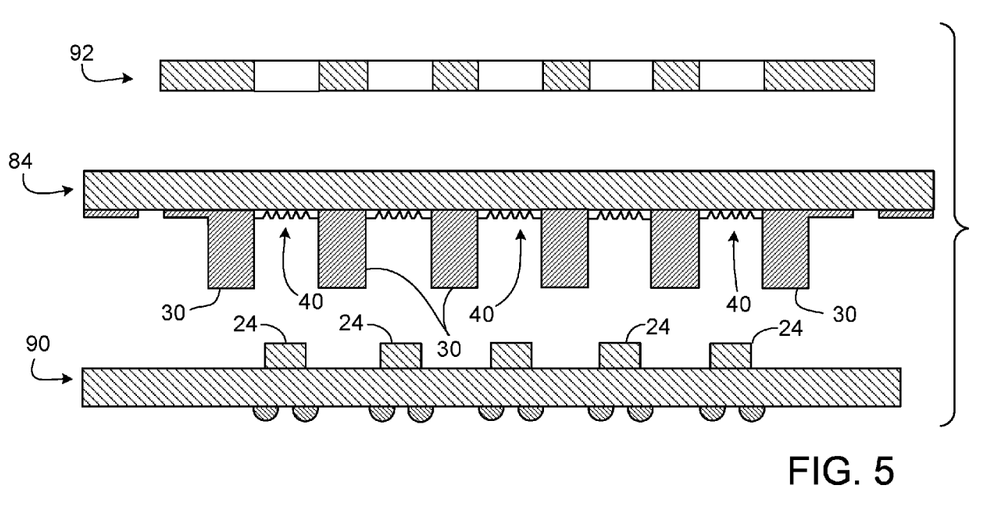
FIG. 5 illustrates a cross-sectional view of forming a wafer stack including a wafer-scale spacer/optics structure.

In some implementations, wafer-scale spacer/optics structure 84 is attached to one or more other wafers to form a wafer stack. For example, FIG. 5 illustrates a substrate wafer 90 (on which are mounted optical components 24, e.g., light emitting or light sensing elements) and a baffle wafer 92, which can be attached to wafer-scale structure 84. Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. The wafers may comprise hardenable materials such as a thermally or UV-curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm. Different materials and dimensions may be appropriate for other implementations. After the wafers 90, 92 are attached to wafer-scale spacer/optics structure 84, the resulting wafer-stack can be separated (along vertical separation lines) to form individual modules like module 20 of FIG. 1.

The particular structure of optical elements 40 can vary depending on the implementation. Thus, in some implementations, each optical element 40 on wafer-scale spacer/optics structure 84 (FIG. 3D) can be, e.g., a lens that is a replica of an optical element replication section 58 and that is recessed in relation to spacer elements 30. Optical elements 40 formed by the replication process described above can be, for example, diffractive lenses, refractive lenses or combined diffractive/refractive lenses.

The foregoing techniques can facilitate formation of a wafer-scale spacer/optics structure using a single replication tool that allows the replicated spacer elements to be made of the same material, or a different material, as the replicated optical elements. In some implementations, it may be desirable to use different materials for the spacer and optical elements in view of the different functionality they are to provide when incorporated into a device. Thus, for example, the disclosed techniques can facilitate manufacture of lens structures and black (non-transparent) spacer structures using a single replication tool. Even when two different replication materials are used, in some cases, no bond line will be visible between the material forming the optical elements and the material forming the spacer elements. Furthermore, by using the same replication tool, some implementations may require only one alignment step for forming the wafer-scale spacer/optics structure.

The disclosed techniques can result, in some cases, in less spacer epoxy being required. For example, in some prior techniques, a 9-inch master might be required to make an 8-inch spacer wafer. Using the techniques described in the present disclosure, such a large master may not be required. Furthermore, by replicating the spacer structure directly onto the optics wafer, shrinkage or expansion of the spacer structure can be reduced or eliminated. The techniques also can help reduce or eliminate the need for strict local confinement of the replicated area, which can allow the optically active area to be larger than when some other manufacture techniques are used.

Figure 6:
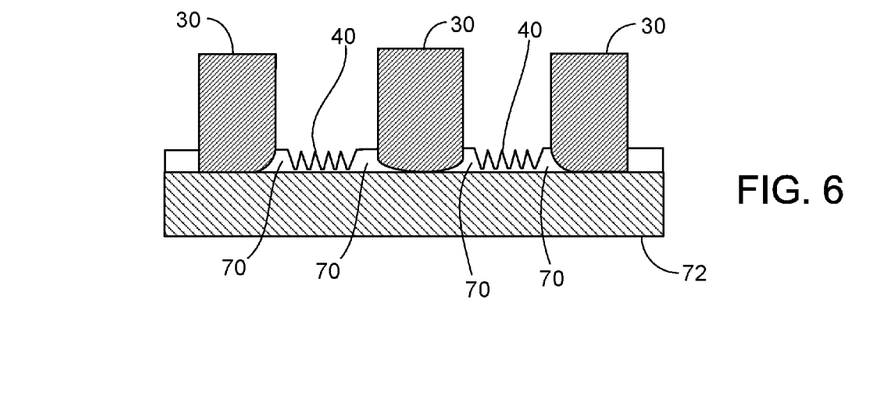
FIG. 6 illustrates a cross-sectional view of another example of replicated spacer elements and optical elements on a wafer.

In some cases, when optics wafer 72 is brought into contact with replication tool 50 as part of the first replication step so that optical element replication sections 58 are embossed into replication material 70 (FIG. 3B), some of the replication material may be pushed outward laterally along the surface of optics wafer 72 (i.e., toward the adjacent spacer replication sections 60). When second replication material 76 subsequently is injected into replication tool 50 (see FIG. 3C), some of that replication material will cover the previously deposited first replication material 70 that is present on areas of optics wafer 70 opposite the spacer replication sections 60. The result is that, in some implementations, a small amount of replication material 70 may be present between the spacer elements 30 and the surface of optics wafer 72 (see FIG. 6). In some cases, a small amount of replication material 70 may be present along a substantial part of the interface between a particular spacer element 30 and optics wafer 72. Such features may remain visible even after the optics wafer or wafer stack subsequently is diced into separate modules (e.g., a module 20 as in FIG. 1).

Other implementations are within the scope of the claims.

What is claimed is:

1. An opto-electronic module comprising:
  an opto-electronic device mounted on a substrate;
  an optics member over the opto-electronic device, wherein the optics member includes a solid transparent portion and a light blocking portion, the light blocking portion laterally surrounding sidewalls of the solid transparent portion;
  a replicated spacer member on a surface of the light blocking portion of the optics member, wherein the replicated spacer member separates the substrate and opto-electronic device from the optics member; and
  a replicated optical element disposed directly on a surface of the solid transparent portion of the optics member, the replicated optical element being substantially aligned with the opto-electronic device and disposed in an area between the transparent portion of the optics member and the substrate,
  wherein the replicated optical element is composed of a first cured material and the replicated spacer member is composed of a second different cured material, and
  wherein some of the first cured material of the replicated optical element is in direct contact with second cured material of the replicated spacer member.

2. The opto-electronic module of claim 1 wherein the first cured material of the replicated optical element abuts a side surface of the second cured material of the replicated spacer member.

3. The opto-electronic module of claim 1 wherein the first cured material of the replicated optical element is present along at least part of an interface between the replicated spacer member and the optics member.

4. The opto-electronic module of claim 1 wherein the replicated optical element includes a lens structure and wherein the replicated spacer member is substantially non-transparent.

5. The opto-electronic module of claim 1 wherein no bond line is visible between the first cured material of the replicated optical element and the second cured material of the replicated spacer member.

* * * * *